US010084103B1

(12) United States Patent
Lewis et al.

(10) Patent No.: US 10,084,103 B1
(45) Date of Patent: Sep. 25, 2018

(54) ELECTRIC FIELD TUNING OF PBS QUANTUM DOTS FOR HIGH EFFICIENCY SOLAR CELL APPLICATION

(71) Applicants: Jason Lewis, Lutz, FL (US); Xiaomei Jiang, Tampa, FL (US)

(72) Inventors: Jason Lewis, Lutz, FL (US); Xiaomei Jiang, Tampa, FL (US)

(73) Assignee: University of South Florida, Tampa, FL (US)

( * ) Notice: Subject to any disclaimer, the term of this patent is extended or adjusted under 35 U.S.C. 154(b) by 700 days.

(21) Appl. No.: 14/071,194

(22) Filed: Nov. 4, 2013

Related U.S. Application Data

(63) Continuation-in-part of application No. 12/862,260, filed on Aug. 24, 2010, now Pat. No. 8,574,685.

(60) Provisional application No. 61/236,271, filed on Aug. 24, 2009.

(51) Int. Cl.
*H02N 6/00* (2006.01)
*H01L 31/042* (2014.01)
*H01L 31/0352* (2006.01)

(52) U.S. Cl.
CPC ........... *H01L 31/035236* (2013.01); *H01L 31/035218* (2013.01)

(58) Field of Classification Search
CPC ............ H01L 31/035236; H01L 31/035218
See application file for complete search history.

(56) References Cited

U.S. PATENT DOCUMENTS

| 8,183,082 B1 | 5/2012 | Lewis et al. | |
|---|---|---|---|
| 2004/0005723 A1* | 1/2004 | Empedocles | B81C 99/008 438/1 |
| 2006/0076557 A1* | 4/2006 | Waller | B82Y 30/00 257/40 |

OTHER PUBLICATIONS

Ryan et al., "Electric-Field-Assisted Assembly of Perpendicularly Oriented Nanorod Superlattices," Nano Lett., 2006, 6 (7), pp. 1479-1482.*
Basu et al., "Evidence for directed self-assembly of quantum dots in a nematic liquid crystal," Phys. Rev. E Stat. Nonlin. Soft Matter Phys. Jul. 2009; 80(1 Pt 1):010701.*
Skaff et al., "The use of 4-substituted pyridines to afford amphiphilic, pegylated cadmium selenide nanoparticles," Chem. Commun., 2003, 52-53.*
Gupta et al., "Self-Corralling Nanorods under an Applied Electric Field," Nano Lett., 2006, 6 (9), pp. 2066-2069.*
(Continued)

*Primary Examiner* — Angelo Trivisonno
(74) *Attorney, Agent, or Firm* — Molly L. Sauter; Nilay J. Choksi; Smith & Hopen, P.A.

(57) ABSTRACT

A thin film and a method of making a thin film. The thin film comprises a patterned substrate, a smooth film of electric field tuned quantum dots solution positioned on the patterned substrate, and a thin layer of metal positioned on the thin film. The method begins by drop-casting a quantum dots solution onto a patterned substrate to create a thin film. While the quantum dots solution is drying, a linearly increasing electric filed is applied. The thin film is then placed in a deposition chamber and a thin layer of metal is deposited onto the thin film. Also included are a method of measuring the photoinduced charge transfer (PCT) rate in a quantum dot nanocomposite film and methods of forming a Shottky barrier on a transparent ITO electrode of a quantum dot film.

19 Claims, 17 Drawing Sheets

A

B

(56) References Cited

OTHER PUBLICATIONS

Niggemann, et al., Realization of Ultrahigh Photovoltages With Organic Photovoltaic Nanomodules, Advanced Materials, 2008, vol. 20, pp. 4055-4060.

Lim, et al., High Voltage Polymer Solar Cell Patterned With Photolithography, Journal of Materials Chemistry, 2009, vol. 19, pp. 5394-5397.

Lafalce et al., Generation and Recombination Kinetics of Optical Excitations in Poly(3-dodecylthienylenevinylene) with Controlled Regioregularity, Journal of Phys. Chem. B, 115 (45), 13139-13148 (2011).

Dedigamuwa, et al., Enhanced charge-transport in surfactant-free PbSe quantum dot films grown by a laser-assisted spray process. Appl Phys Lett. 2009, 95(12), 122107.

Murray, C.B. and C.R. Kagan. Synthesis and Characterization of Monodisperse Nanocrystals and Close-Packed Nanocrysal Assemblies. Annu. Rev. Mater. Sci. 2000, 30:545-610.

Ahmed, Waqqar et al. Quantitative Analysis of Gold Nanorod Alignment after Electric Field-Assisted Deposition. Nano Letters, 2009, vol. 9, No. 11; 3786-3794.

Ulbricht, Ross et al. Transparent carbon nanotube sheets as 3-D charge collectors in organic solar cells. Solar Energy Materials & Solar Cells 91 (2007) 416-419.

Spuch-Calvar, Miguel et al. Synthesis and Optical Characterization of Submicrometer Gold Nanotubes Grown on Goethite Rods. Langmuir 2008, vol. 24, No. 17; 9675-9681.

Lattante, Sandro. Electron and Hole Transport Layers: Their Use in Inverted Bulk Heterojunction Polymer Solar Cells. Electronics 2014, 3,132-164.

Ulbricht, R. et al. Polymeric solar cells with oriented and strong transparent carbon nanotube anode. Phys. stat sol. (b)243, No. 13, 3528-3532 (2006).

Hanrath et al., PbSe Nanocrystal Network Formation during Pyridine Ligand Displacement, ACS Applied Materials & Interfaces, 2009, vol. 1, No. 2, pp. 244-250.

Turyanska et al., Tailoring the physical properties of thiol-capped PbS quantum dots by thermal annealing, Nanotechnology, 2009, vol. 20, 315604.

* cited by examiner

| | PFO | MEH-PPV | P3HT | | PbSe Nanocrystal | | | Bulk PbSe |
|---|---|---|---|---|---|---|---|---|
| | | 3.3 | 3.2 | | | | | |
| | | | | 4.27 | 4.4 | 4.565 | 4.535 | 4.57 |
| | | 5.4 | 5.1 | 5.37 | 5.175 | 5.095 | 4.935 | 4.85 |
| PL$_{max}$ (eV) | | | | | 1.1 | 1.60 | 1.86 | 2.55 |
| PL$_{max}$ (μm) | | | | | 1.13 | 0.78 | 0.67 | 0.59 |
| E$_{g\_theory}$ (eV) | | | | | 1.03 | 0.86 | 0.61 | 0.53 |
| E$_{g\_exp}$ (eV) | | | | | 1.1 | 0.775 | 0.53 | 0.40 | 0.278 |
| Size (nm) | | | | | 4.0 | 5.0 | 8.0 | 10 |

ELECTRIC FIELD TUNING OF PBS QUANTUM DOTS FOR HIGH EFFICIENCY SOLAR CELL APPLICATION

CROSS REFERENCE TO RELATED APPLICATIONS

This application is a continuation-in-part of U.S. patent application Ser. No. 12/862,260, entitled "Electric Field Tuning of PbS Quantum Dots for High Efficiency Solar Cell Application", filed Aug. 24, 2010, which claims priority to U.S. Provisional Patent Application No. 61/236,271, entitled "Electric Field Tuning of PbS Quantum Dots for High Efficiency Solar Cell Application", filed Aug. 24, 2009, which is herein incorporated by reference.

FIELD OF INVENTION

This invention relates to solar cells; more specifically to the use of quantum dot films in solar cells.

BACKGROUND

More energy from the sun strikes the Earth in one hour than all the energy consumed on the planet in one year, yet solar electricity accounts for less than 0.02% of all electricity produced worldwide. The enormous gap between the potential of solar energy and its use is due, in part, to the cost/conversion capacity. The development of third generation solar cells (high efficiency plus low cost) is of paramount importance to both humanity and nature.

Solution-processability has been recognized as a feasible solution to cost issues, and novel mechanisms such as carrier multiplication a possible route to achieve higher efficiency levels. In both these aspects, there is potential in colloidal infrared quantum dots, such as lead selenide (PbSe) and lead sulfide (PbS). The addition of quantum dots to present cost-effective organic solar materials (i.e., polymers) could double power conversion efficiency to twelve percent due to the infrared absorbers' enhanced spectrum match with sunlight. Initial observation of carrier multiplication and recent confirmation of it in these quantum dots holds fundamental importance in current solar cell development.

However, present PbSe and PbS quantum dots research has seemed to hit a 'bottleneck', hindering the achievement of their full potential. Efficient photo-induced charge transfer has not been observed in these quantum dot composites, due largely to the lack of a measurement technique which would allow a clear separation between exciton dissociation and charge transport phenomena. This makes it challenging to gain detailed insight into either phenomenon, impeding rational design of absorber layers. Furthermore, the majority of the transport studies so far have been limited to the planar structure field effect transistors (FET), whereas an applicable quantum dot photovoltaic (PV) device is of sandwich structure, and it is known that the transport characteristics could be very different in these two structures.

Quantum dots are essentially nanocrystals consisting of tens to hundreds of atoms. FIGS. 1(A) and (B) illustrate the rock salt crystal structure of PbSe quantum dots, with quantum dot core 1 and ligand 2. Due to the nanocrystal's small size (smaller than the exciton Bohr radius of the bulk semiconductor), strong quantum confinement results in discrete energy levels and bigger band gaps compared with the respective bulk semiconductor. FIG. 2 shows the quantized energy levels of a PbSe quantum dot. The dashed line represents the gap state energy level found on IV-VI quantum dots. Infrared quantum dots such as PbSe or PbS have size-tunable band gaps ranging from 0.4~1.1 eV. Consequently, their optical absorption covers solar spectrums from infrared to ultraviolet. The graph of FIG. 3 illustrates the absorption spectra of variously sized PbSe quantum dots. Arrows indicate the first excitonic peak ($1S_h$-$1S_e$) in the infrared region. Another tunable factor in quantum dots comes from their passivation layer (ligands), which largely influences optical and electronic properties.

In general, the photovoltaic (PV) process in the quantum dots system (quantum dots with one or two other constituents) consists of four successive processes:
(i) absorption of photons, which creates excitons (bounded electron-hole pairs);
(ii) exciton dissociation (or photo-induced charge transfer) following the exciton diffusion to a region (for instance, the interface of two different components);
(iii) free carriers transport separately toward the anode (holes) and cathode (electrons), where
(iv) charge collection occurs.

As an example, FIG. 4 is a diagram of a hybrid PV device made of PbSe quantum dots and conducting polymer P3HT. FIGS. 5(A) and (B) show how photo current is generated in the hybrid PV device. FIG. 5(A) shows electron e transferring from the P3HT polymer to the PbSe quantum dot. FIG. 5(B) shows the hole h transfer from the PbSe quantum dot to the P3HT polymer. The hybrid device of FIG. 4 is more thoroughly described in Lewis, et al. (U.S. Pat. No. 8,183,082), which is herein incorporated by reference.

Despite being one of the most promising solutions for solar energy utilization, the present performance of such infrared quantum dot-based PV devices are far from their expectations. The two major causes for their relatively low efficiency have been recognized in current research:
(1) inefficient exciton separation at the quantum dot/constituent interface; and
(2) poor charge percolation pathways to the extracting electrodes.

During the colloidal synthesis process, certain ligands (usually TOPO or oleic acid) are used to passivate quantum dot surfaces to prevent aggregations. Incomplete passivation could result in surface trap sites, and with the bulky ligands serving as barriers for exciton dissociation at the quantum dot/constituent interface, photo-induced charge transfer (PCT) is hindered. The addition of quantum dots without the optimization of their interfaces with other constituent(s)—i.e., without the formation of separate percolation pathways for electrons-e and holes-h—causes huge loss of the photo-generated free carriers due to e-h recombination.

Various kinds of post-synthesis chemical treatments of quantum dots have proven to be efficient to enhance quantum dot transport properties without sacrificing their confinement uniqueness. Recently, a series of studies on quantum dot device physics regarding ligand exchange with butylamine have demonstrated improved infrared response of PbS quantum dot photovoltaic devices and photoconductors. Thermal treatment is another method to improve carrier mobility and conductance of PbSe NC film via enhanced interdots electronic coupling.

SUMMARY OF THE INVENTION

A thorough transport study in infrared quantum dot systems is vital to the fabrication of high-performance quantum dot-based solar cells. Current research also desires an effective way to finely tune quantum dot transport properties along the desired current flow direction.

The present invention includes, inter alia, a unique spectral gauge measurement and a novel electrical tuning method for directed transport properties. The combination of such method can be used in the fabrication of commercially viable quantum dot-based solar cells.

The present invention includes a method of making a thin film (using an electrical tuning method). The method begins by drop-casting a quantum dots solution onto a patterned substrate to create a thin film. The substrate may be a glass substrate. Such a glass substrate may be an indium tin oxide (ITO) glass substrate. The quantum dots solution may be a lead sulfide (PbS) quantum dots solution. While the quantum dots solution is drying, a linearly increasing electric field is applied. In an embodiment, the electric field starts at about 5V and linearly increases in about 5V increments up to about 50V. The electric filed is preferably a DC electric field. The duration between each increment increase may be between about one and about two minutes. The thin film is then placed in a deposition chamber and a thin layer of metal is deposited onto the thin film. There may be a twenty minute wait time after applying the electric field before placement of the thin film into the deposition chamber.

The deposition chamber may be an organic deposition chamber. The deposition chamber may be integrated with a N2 glove box. The metal deposited on the thin film may be aluminum.

The present invention also includes a thin film (made using an electrical tuning method). The thin film comprises a patterned substrate, a smooth film of electric field tuned quantum dots solution positioned on the patterned substrate, and a thin layer of metal positioned on the thin film. The substrate may be a glass substrate. Such a glass substrate may be ITO glass substrate. The quantum dots solution may be a PbS quantum dots solution. The metal deposited on the thin film may be aluminum.

The present invention further includes a method of measuring the photo-induced charge transfer (PCT) rate in a quantum dot nanocomposite film (the spectral gauge measurement). The method begins by measuring the photo-induced absorption spectra of a plurality of quantum dot nanocomposites. Below-gap excitations and above-gap excitations are conducted in the measurement of the photo-induced absorption spectra. The change of the spectral gauge is monitored in terms of energy level and intensity. The PCT rate is derived based on the change of the spectral gauge.

In addition, the present invention includes a method of forming a Shottky barrier on a transparent ITO electrode of a quantum dot film. The method comprises spin coating a thin layer of Poly(3,4-ethylenedioxythiophene) poly(styrenesulfonate) (PEDOT:PSS) onto the ITO electrode, and then applying reverse bias to an extraction contact of the quantum dot film.

The present invention also includes another method of forming a Shottky barrier on a transparent ITO electrode of a quantum dot film. In this method, a thin layer of gold is evaporated onto the ITO electrode, and then a reverse bias is applied to an extraction contact of the quantum dot film.

Exemplary materials that may be used include IV-VI colloidal quantum dots such as PbSe and PbS. The general concept of nanocomposite is to choose another constituent material to form certain donor/acceptor (D/A) combinations with these infrared quantum dots to facilitate PCT and sequential FCT processes. FIG. 6 lists the band alignment for a few of exemplary materials. By careful choice of the material combinations, the band alignment can be tuned from type I ('straddling', against PCT) to type II ('staggered', in favor of PCT).

BRIEF DESCRIPTION OF THE DRAWINGS

For a fuller understanding of the invention, reference should be made to the following detailed description, taken in connection with the accompanying drawings, in which:

FIG. 6 is a diagram illustrating energy level positions of exemplary materials measured by electrochemical cyclic voltammetry.

DETAILED DESCRIPTION

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Recent chemical and thermal treatment methods, although showing success in improving quantum dot carrier mobility and film morphology, lack the ability to differentiate quantum dot transport properties along different directions. A novel method of achieving free carrier transport of quantum dots in a more controlled way along the desired transport direction is described herein using electrical current. The methodology produces a smooth film of electric field tuned quantum dots solution positioned on a patterned substrate, and a thin layer of metal positioned on the thin film.

As used herein, the term "about" means approximately or nearly and in the context of a numerical value or range set forth means±15% of the numerical.

As used herein, the term "Group IV-VI" refer to compounds located at locations IVA through VIA on the periodic table. These include semiconducting materials, and specifically chalcogenides.

As used herein, the term "nanoparticle" means one or more nanoparticles with an average diameter ranging from 1 to 100 nm.

PbTe was an exemplary material however other nanocomposites are envisioned. Without limiting the invention, examples include semiconductor-semiconductor composites, metal-metal composites, and metal-non-metal composites, such as PbSe, PbSe—PbTe, $SbTe_2$—PbTe, $AgSbTe_2$—PbSe, and alloys of PbTe and PbSe such as $PbSn_xSe_{1-x}$.

Example 1

Figure 1:
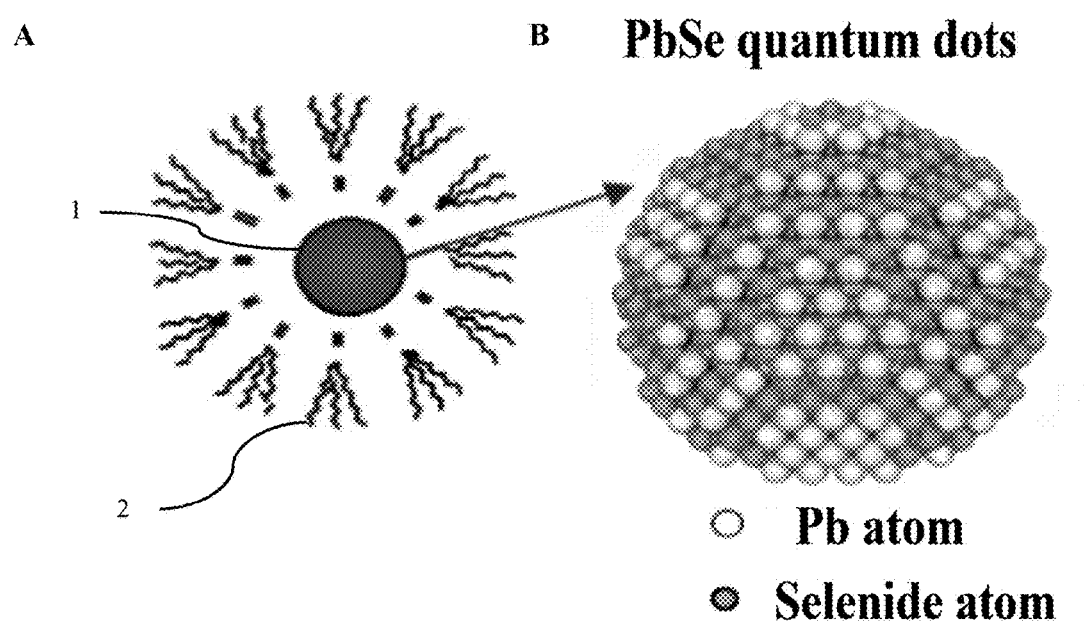
FIGS. 1(A) and (B) are diagrams of the rock salt crystal structure of a lead selenide (PbSe) quantum dots (QD). (A) an illustration of a quantum dot with oleic acid ligand surrounding the QD structure; (B) a rock salt crystal structure of PbSe nanocrystal forming the QD.
Figure 2:
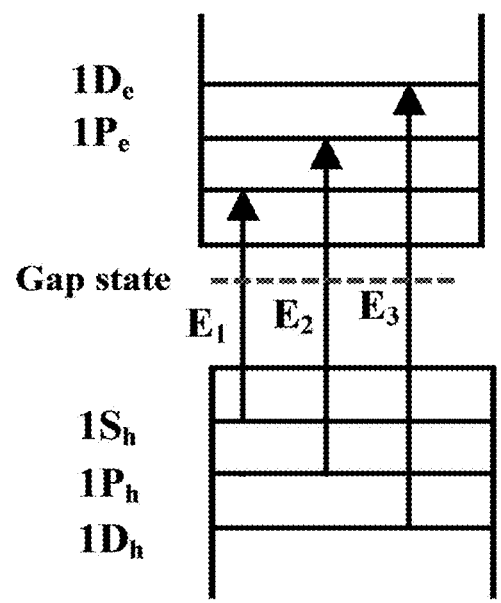
FIG. 2 is a diagram of the quantized energy levels of a PbSe quantum dot. The dashed line represents the gap state energy level found on IV-VI quantum dots.
Figure 3:
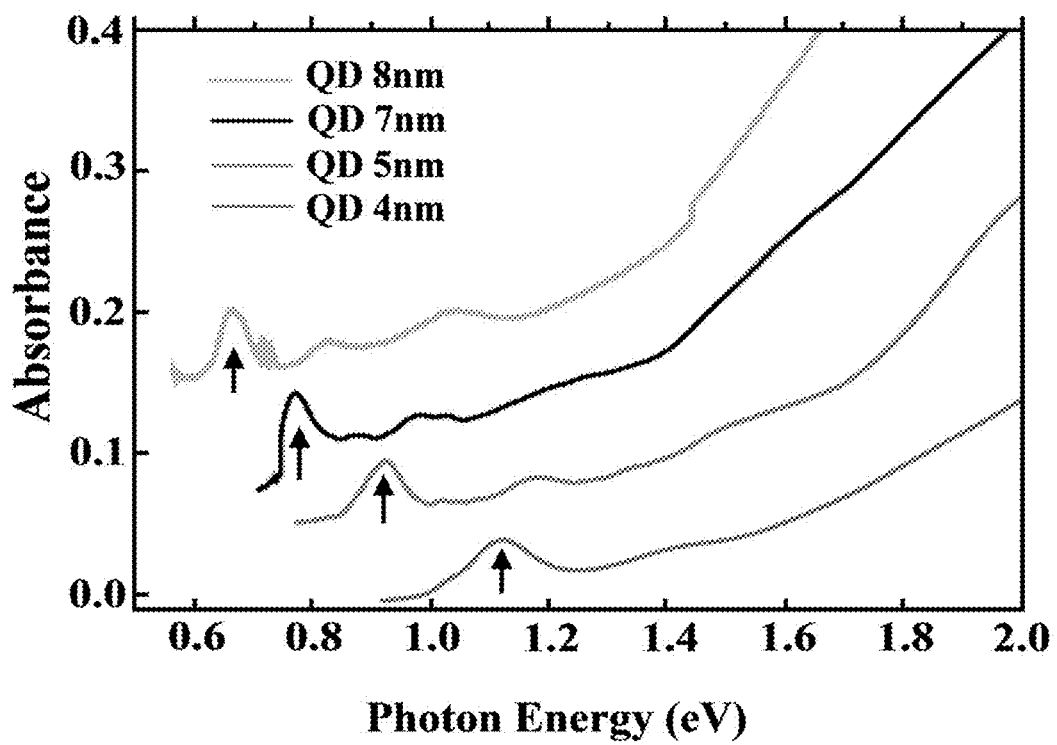
FIG. 3 is a graph of the absorption spectra of variously sized PbSe quantum dots (QD). Arrows indicate the first excitonic peak ($1S_h$-$1S_e$) in the infrared region.
Figure 4:
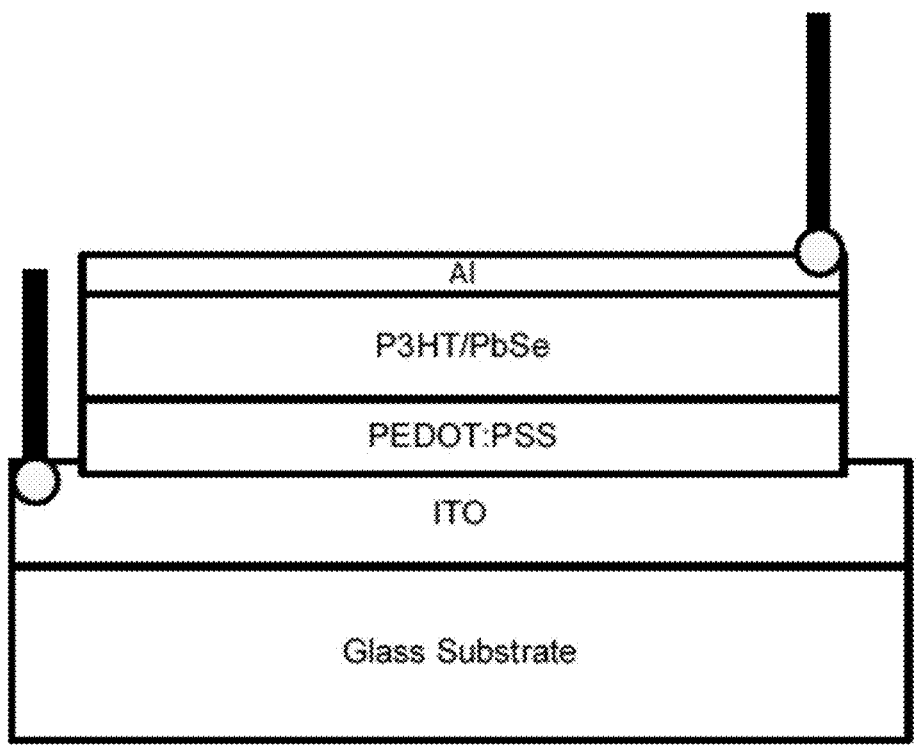
FIG. 4 is a diagram of a bulk heterojunction (BHJ) hybrid device structure.
Figure 5:
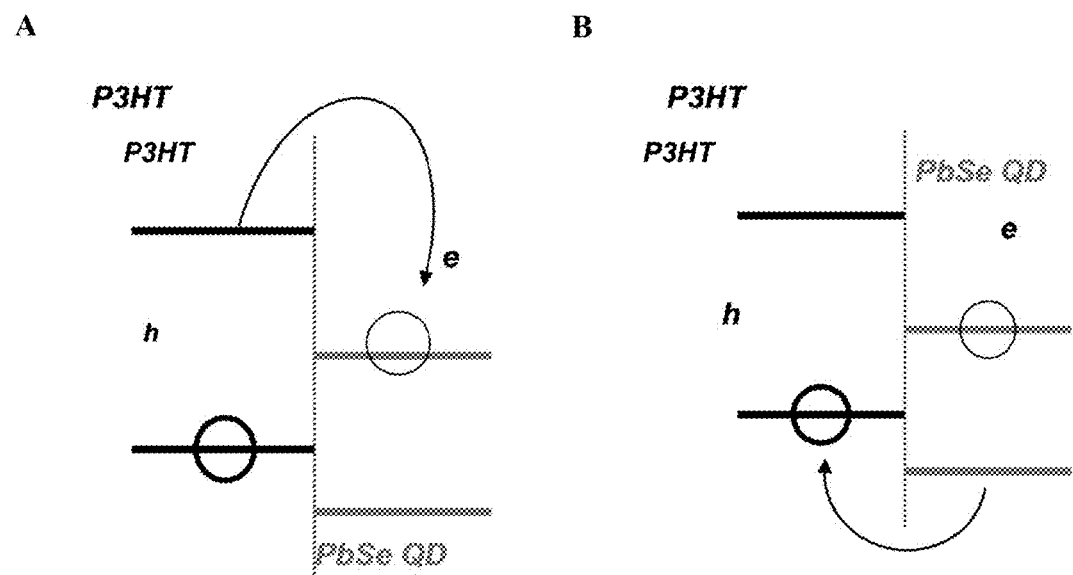
FIGS. 5(A) and (B) are diagrams showing electron transfer. (A) depicts an electron-e transfer from P3HT polymer to PbSe quantum dot; (B) a hole-h transfer from PbSe quantum dot to P3HT polymer.
Figure 7:
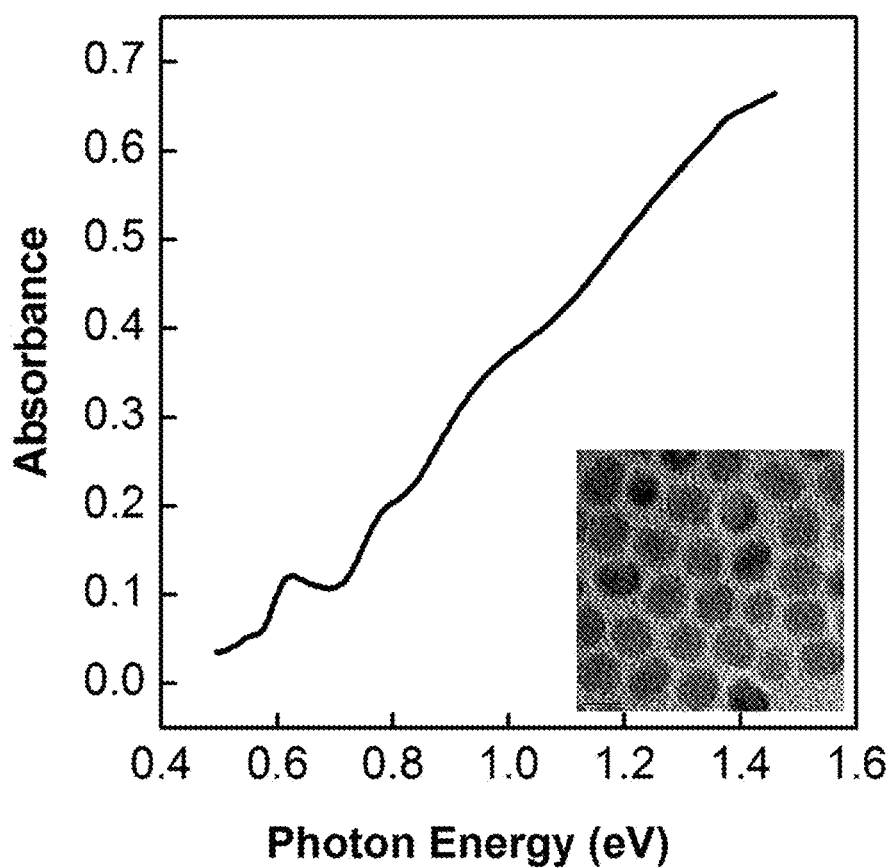
FIG. 7 is a graph illustrating the absorption spectrum of 9 nm PbSe quantum dots in diluted tetrachloroethylene solution. The inset shows a high resolution TEM image demonstrating the monodispersity of the prepared quantum dots.

The quantum dots (e.g. lead selenide (PbSe) and PbS quantum dots) with different-sized capping ligands were synthesized using a modified colloidal synthesis procedure. Briefly, a colloidal solution containing 9-10 nm PbSe nanoparticles was formed by a solvothermal technique, forming QDs coated with oleic acid that prevents agglomeration (Dedigamuwa, et al., *Enhanced charge-transport in surfactant-free PbSe quantum dot films grown by a laser-assisted spray process*. Appl Phys Lett. 2009, 95(12), 122107). The precipitated PbSe nanocrystals were redispersed in hexane. The surfactants cause the particles to separate by about 2-3 nm. As an example, FIG. 7 shows an absorption spectrum of 9 nm PbSe quantum dots synthesized by a modified colloidal synthesis procedure. The inset shows a high resolution transmission electron micrograph (HRTEM) demonstrating uniform size distribution, which is confirmed by the narrow FWHM of the absorption peak at about 0.65 eV.

A colloidal synthesis setup can be used to prepare tailored quantum dots. All initial optical characterization including absorption and photoluminescence can be done using the continuous wave absorption spectroscopy setup. Crystallinity can be assessed using x-ray diffraction. Size distribution and crystal shape can be characterized using transmission electron microscopy. Transport properties such as mobility and conductivity can be measured in either lateral (field effect transistor geometry) or sandwich structures. Temperature dependence of thin film conductivity can be measured in a Janis 10K closed-cycle refrigerator cryostat.

Electronic structure, stoichiometry, and interface chemistry of the prepared quantum dots can also be examined with photoemission. These experiments will yield energy level positions and the surface chemistry of PbSe/PbS quantum dots.

Example 2

An indium tin oxide (ITO) with and Corning® low alkaline earth boro-aluminosilicate glass substrate (Delta Technology, Inc.) having a nominal sheet resistance of 4-10 Ω/square was pre-cut 4"×4", and patterned for use as a substrate. Any patterning known in the art is acceptable. For example, the substrate is patterned using a positive photo resist, Shipley 1813, spin coated at 4500 rpm and soft baked on a hotplate for 3 minutes at 90° C. The structure was then exposed to a UV lamp for 1.4 seconds using a constant intensity mode set to 25 watts. The structure was developed for about 2.5 minutes using Shipley MF319, rinsed with water, and hard-baked at 145° C. for 4 minutes. Any excess photoresist was cleaned off with acetone and cotton. The substrate was etched 5-11 minutes with a solution of 20% HCl and 7% HNO$_3$ at 100° C.

A layer of quantum dots is then applied to the patterned substrate. A solution of PbS quantum dots was drop-casted or spin coated onto the substrate. Exemplary materials that may be used include IV-VI colloidal quantum dots such as cadmium selenide (CdSe), cadmium sulfide (CdS), lead selenide (PbSe) and lead sulfide (PbS). Colloidal quantum dot such as cadmium selenide (CdSe) and cadmium sulfide (CdS) have diameters from 2 nm~8.5 nm with tunable band gaps ($E_g$) from 2.8 eV~1.9 eV for CdSe, and 2 nm~6 nm for CdS ($E_g$ from 3.55 eV~2.65 eV). The general concept of nanocomposite is to choose another constituent material to form certain donor/acceptor (D/A) combinations with these infrared quantum dots to facilitate PCT and sequential FCT processes. FIG. 6 lists the band alignment for a few of exemplary materials. By careful choice of the material combinations, the band alignment can be tuned from type I ('straddling', against PCT) to type II ('staggered', in favor of PCT). Significant improvement of photoconductivity across the device has been demonstrated after treating the pristine quantum dot (with oleic acid ligand) film with an electric field. Electrical treatment can be applied to ligand-exchanged quantum dots. The choice of ligands may be based on polarity. For instance, both pyridine and butylamine are polar, like oleic acid, except much smaller. From this one would expect to see even higher photoconductivity and mobility on these ligand-exchanged quantum dots following the electric field treatment.

A reliable protocol to make smooth film on various kinds of substrates (glass, sapphire or Si) can be fulfilled by appropriate cleaning procedures for different substrates, pre-treatment of substrates via HMDS vapor, PEDOT:PSS thin layer (<30 nm), oxygen plasma cleaning, and combinations of these methods. For example, substrates can be cleaned using acetone followed by a 2-propanol ultrasonic bath, and then wetting with chloroform or other organic solvents. PEDOT:PSS solution was then diluted according to the ratio: 3:1 with water, and spin-coat PEDOT:PSS at 6100 rpm.

Figure 8:
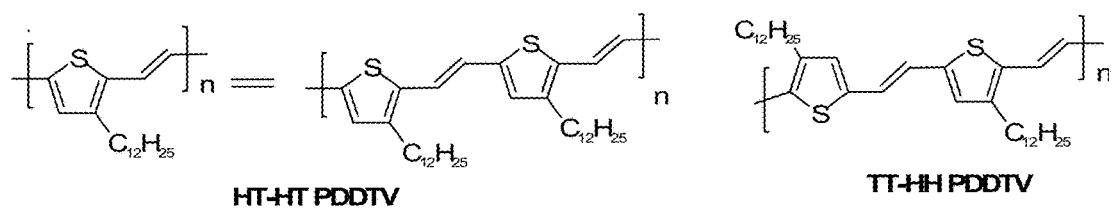
FIGS. 8(A) and (B) are diagrams of the chemical structures. (A) shows novel polymers including monosubstituted polythienylvinylene (PTV), poly(3-dodedyl-2,5-thienylenevinylene)s HT-HT PDDTV (left) and TT-HH PDDTV (right) (See, Zhang, et al., *Synthesis and Characterization of Fully Regioregular Headz-to-Tail Poly(3-Dodedyl-2,5-Thienylenevinylene) for Opto-Electronic Applications*, Polymer Chemistry, 1, 663-669, (2010)); (B) shows a novel polymer poly(3-dodecylthienylenevinylene) (Lafalce et al., *Generation and Recombination Kinetics of Optical Excitations in Poly(3-dodecylthienylenevinylene) with Controlled Regioregularity*, Journal of Phys. Chem. B, 115 (45), 13139-13148 (2011)).
Figure 8:
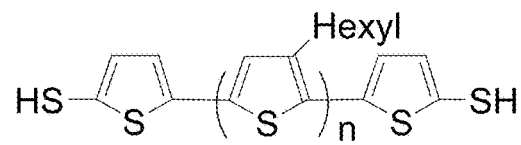

Other layer constituent materials can be several kinds of conducting polymers. For example, polymers with different band gaps such as P3HT ($E_g$=1.9 eV), MEH-PPV ($E_g$=2.2 eV), PPE ($E_g$=2.6 eV), and low energy (between 1-2 eV) gap and self-assembly enabled polymers. For enhanced PCT between polymers and quantum dots, it is important to increase the miscibility among them and enable the formation of good interfaces. For example, the polymer is mixed at a polymer to quantum dot (polymer:QD) ratio of 1:1. Examples of some of these new polymers are shown in FIGS. 8(A) and (B).

Interfaces are very important for exciton dissociation and charge transfer in quantum dot composites. There are several interfaces in a quantum dot film: the interface of the ligand/quantum dot surface; interfaces between quantum dots, and interfaces of a quantum dot with substrate. These interfaces potentially serve as traps and recombination centers for photo-generated carriers, resulting in loss of collectable charges and altered lifetime of the gap states. Another complication comes from the possible formation of a dipole layer at the interface, which would change the effective band alignment and the quantum dot energy levels. All these interfacial issues manifest themselves in the change of PCT characteristics. In the past, interface engineering was performed via chemical treatments, such as ligand exchange in a solution prior to film formation and ligand condensation or removal on films. However, ligand removal processes involve very harmful chemicals such as hydrazine, and also generate deep trap states brought in by the chemical treatments.

Figure 9:
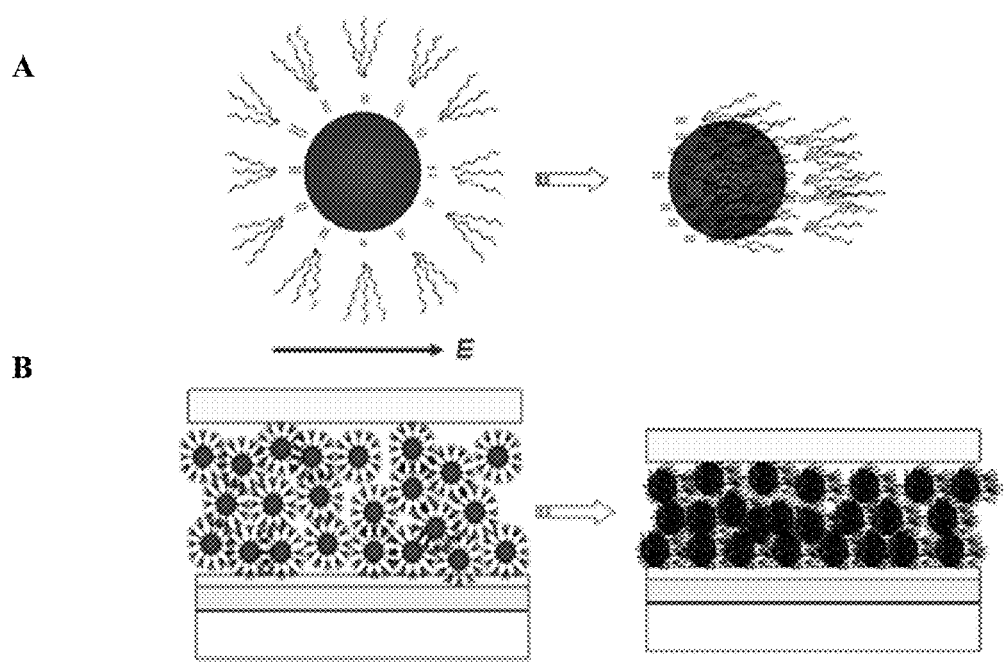
FIGS. 9(A) and (B) are diagrams of quantum dot alignment. (A) shows a PbS quantum dot without (left) and with (right) electrically aligned oleic acid ligands; (B) shows an untreated film (left) and in an electrically treated film (right). The quantum dots in the electrically treated film (right) are closer packed than the quantum dots in the untreated film (left). The quantum dots of the electrically treated film (right) have a shorter vertical transport path and are better electronically coupled than the quantum dots of the untreated film (left).

Film morphology plays an essential role in determining optoelectronic properties and would affect the result of the PCT process. Manipulation of film morphology during and after the film formation process is another important part of the interface engineering in quantum dot composites. During the drying process of the solution, a linearly increasing DC electric field was applied, starting at about 5V and linearly increasing in about 5V increments up to about 50V. The duration between each increment increase was optionally between about one and about two minutes. In some embodiments, the voltage was held for approximately 2 minutes, followed by a manual voltage increase over about 30-40 seconds to achieve the next 5V increment. The observed DC current was about 35 mA. After about twenty minutes, the quantum dots film completely dried up and a smooth film was observed (much smoother than the original drop-cast quantum dots from the same solution. In the alternative, thermal treatments are designed to further enhance film morphology. Thermal treatment conditions are expected to vary with other parameters such as solvent used and concentration of materials. FIGS. 9(A) and (B) show the alignment of quantum dots ligands with the electric field and the formation of a much denser film due to closer packing of the quantum dots. The thin film was then placed in an organic deposition chamber inside a N$_2$ glove box.

Example 3

Devices were prepared for TOF and CELIV measurements. While complimentary planar structure (FET device) or sandwich structure (normal PV device) can be fabricated for the analysis, sandwich structure devices were fabricated.

Figure 10:
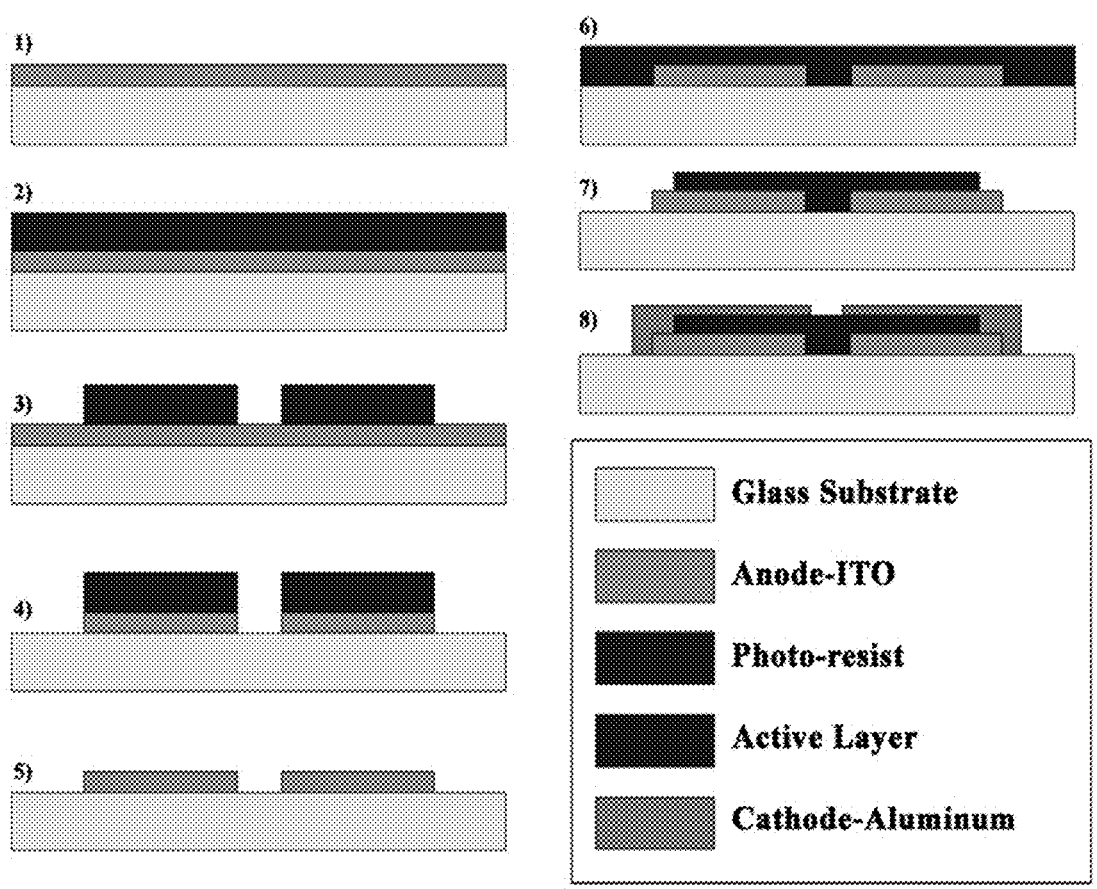
FIG. 10 is a stepwise chart illustrating the fabrication process for a sandwich photovoltaic (PV) device.
Figure 11:
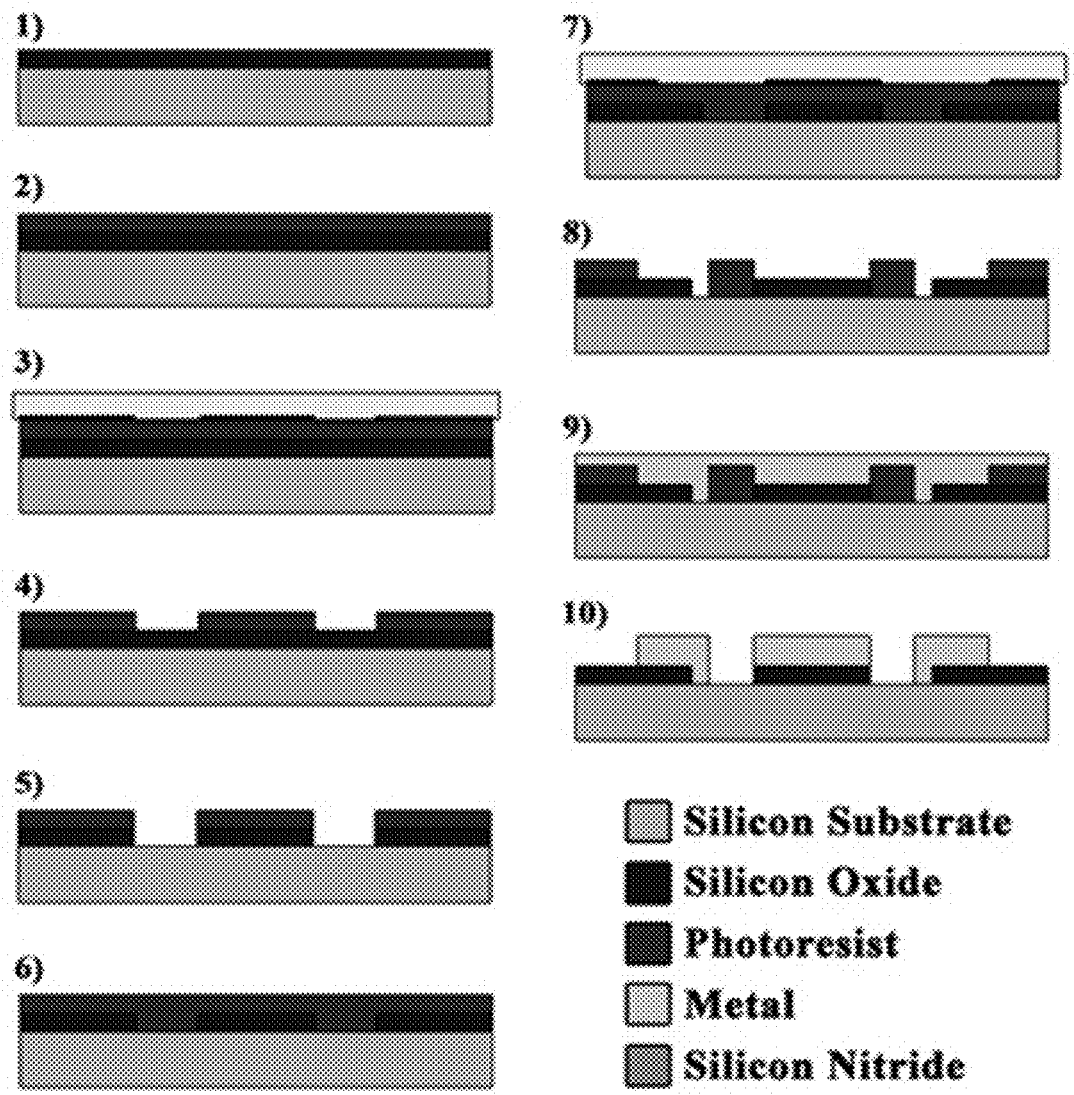
FIG. 11 is a stepwise chart illustrating the fabrication process for a planar FET device.

Devices can be fabricated in an oxygen and humidity controlled device fabrication facility, which includes an customized Mbraun MB200M glove box system, integrated with Ångstrm Åmod four-source co-deposition system for high vacuum (<10$^{-7}$ torr) metal and organic deposition, as described in U.S. patent application Ser. No. 12/862,260. A built-in Laurel programmable spin-coater allows the fabrication of devices inside the inert gas atmosphere. This setup provides an ideal controlled environment for device stability studies. Flow charts of the fabrication processes for the sandwich PV device and planar FET device, are shown in FIGS. 10 and 11, respectively. The fabrication process for the sandwich PV device is further described in Lewis, et al. (U.S. Pat. No. 8,183,082).

Briefly, a substrate, such as silicon, was prepared. The substrate may be glass coated with an indium titanium oxide (ITO) anode layer, as seen in FIG. 10. For example, an ITO-coated glass substrates (>85% transmittance, 5-15 Ω/sq) was cut into 1 in.×1 in. pieces and patterned as described in Lewis, et al. (U.S. Pat. No. 8,183,082). Alternatively, the substrate is silicon, which is patterned and etched to selectively remove the upper silicon dioxide layer, as seen in FIG. 11. After an electrode is applied (or etched as in the ITO coated glass), a layer of poly(3,4ethylenedioxythiophene):poly(styrenesulfonate) (PEDOT:PSS) (Baytron 500) was optionally applied to a patterned surface of the substrate, as discussed in Lewis, et al. (U.S. Pat. No. 8,183,082). A quantum dot active layer was then applied to either the substrate or the PEDOT:PSS and DC voltage was applied across the oleic acid-QDs, as discussed in Example 2. This caused the oleic acid ligands to align in a single direction, thereby forming an aligned QD layer. Significant improvement of photoconductivity across the device has been demonstrated after treating the pristine quantum dot (with oleic acid ligand) film with an electric field, i.e. electrically tuning the transport in the quantum dot film. Electrical treatment can be applied to ligand-exchanged quantum dots. The choice of ligands may be based on polarity. For instance, both pyridine and butylamine are polar like oleic acid, except much smaller. From this one would expect to see even higher photoconductivity and mobility on these ligand-exchanged quantum dots following the electric field treatment.

Finally, an aluminum layer was deposited onto the aligned QD layer. A patterned shadow mask was precisely aligned to the substrate and loaded into the deposition chamber. Aluminum was chosen for the cathode due to its desirable work function (for collection of electrons) and cost-effectiveness. Deposition of aluminum was performed using thermal vacuum deposition under high vacuum ($>1\times10^{-6}$ torr) at room temperature, with a final thickness of 100 nm to form a cathode of the PV device.

Figure 12:
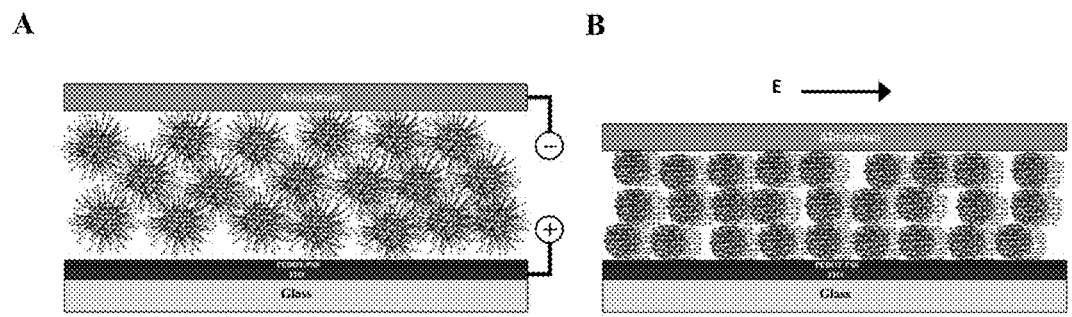
FIGS. 12(A) and (B) are diagrams of a cross sectional view of a PV sandwich structure device. (A) shows the device before electric tuning; and (B) shows the device after electric tuning.
Figure 13:
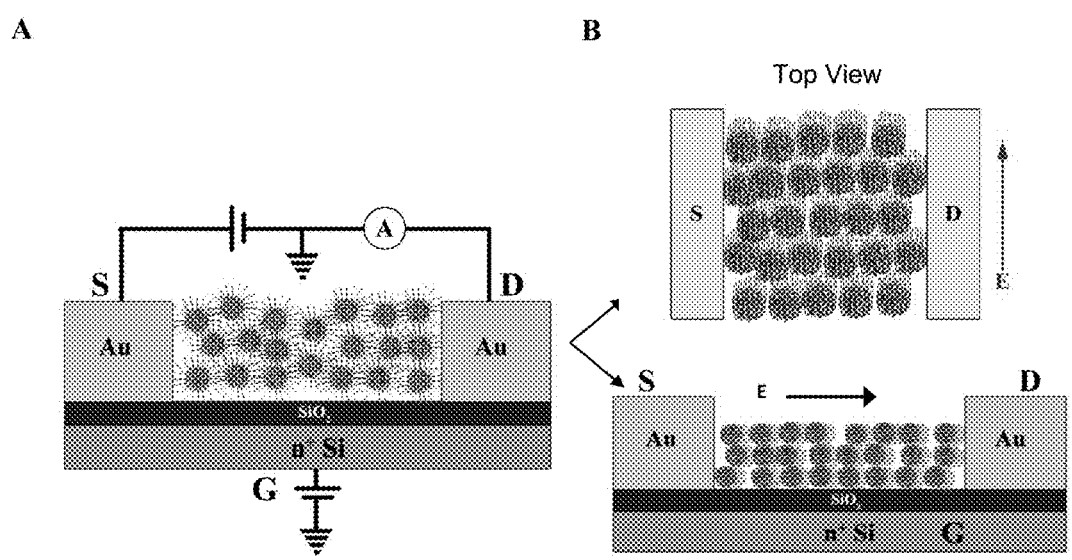
FIGS. 13(A) and (B) are diagrams of a cross sectional view of a FET device. (A) shows the device before electric tuning; and (B) shows the device after electric tuning. In the FET device, the difference in horizontal transport properties of quantum dots with electric fields applied parallel (upper right) and perpendicular (lower right) to the gap can be studied. With gate modulation it is then possible to obtain density of states for electrons.

FIGS. 12 and 13 show a cross section view of these two types of devices. In the sandwich structure device (normal PV device), shown in FIG. 12, one could study the vertical transport properties of treated quantum dots. In FET device, shown in FIG. 13, one could study the difference in horizontal transport properties of quantum dots with electric fields applied parallel (upper right part of FIG. 13) and perpendicular to the gap (lower right part of FIG. 13); with gate modulation it is then possible to obtain density of states for electrons. Combinations from both measurements would form a comprehensive picture about 3-D anisotropy transport characteristics tuned by electric field. Quantum dots with different sizes, ligand groups and crystalline structures (i.e., rock salt crystal quantum dot like PbSe, or Wurtzite crystal quantum dots like CdSe) can be chosen. Temperature dependence of conductivity can be measured to withdraw information on the transport mechanism.

Example 4

Synthesized quantum dots are practically insulators due to the original bulky passivation ligands. For application in any optoelectronic device, quantum dots must be treated chemically and/or thermally to become electronically coupled. Although such treatments have remarkably boosted quantum dot conductivity and mobility, the controllability of transport mobility is quite low. Quantum dot photovoltaic devices are normally of a sandwich structure as shown in FIG. 9(B), and vertical carrier transport is of more importance than that the current flow parallel to the substrate direction. It is thus important to be able to further 'guide' the carrier transport to have certain preference of direction, i.e., anisotropic transport.

Using devices described in Example 3, with the thin film electrically tuned using a DC electric field to 'align' the ligands with the external electric field, a smooth continuous QD film was generated. Because the original ligand of quantum dots, the oleic acid, is polar, a DC electric field was used to 'align' the ligands with the external electric field so the transport perpendicular to the electric field has fewer barriers.

Figure 14:
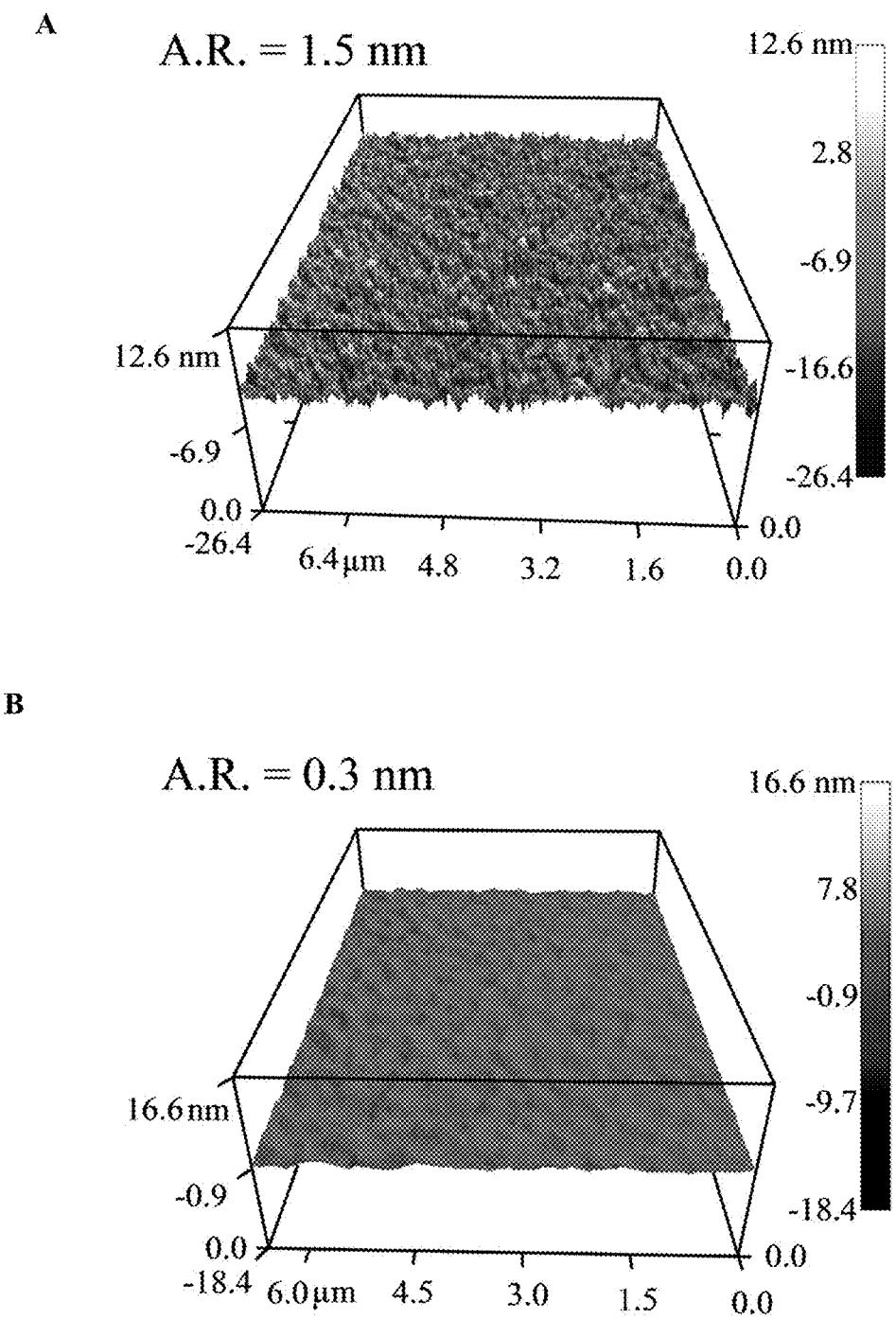
FIGS. 14(A) and (B) are 6.5 μm×6.5 μm AFM images (tapping mode, amplitude) of PbS film on ITO. (A) shows pristine with average roughness (A.R.) of the film about 1.5 nm, and (b) shows electric field tuned with A.R. about 0.3 nm.

Though smooth, continuous films are typically very difficult to achieve, AFM scanning showed the film morphology with more than 5× improve in film smoothness when compared to a pristine quantum dot film, as seen in FIGS. 14(A) and (B). QD film morphology is shown to affect charge mobility of QDs. As such, the modifications to the quantum dot film further enhance photoconductivity.

Figure 15:
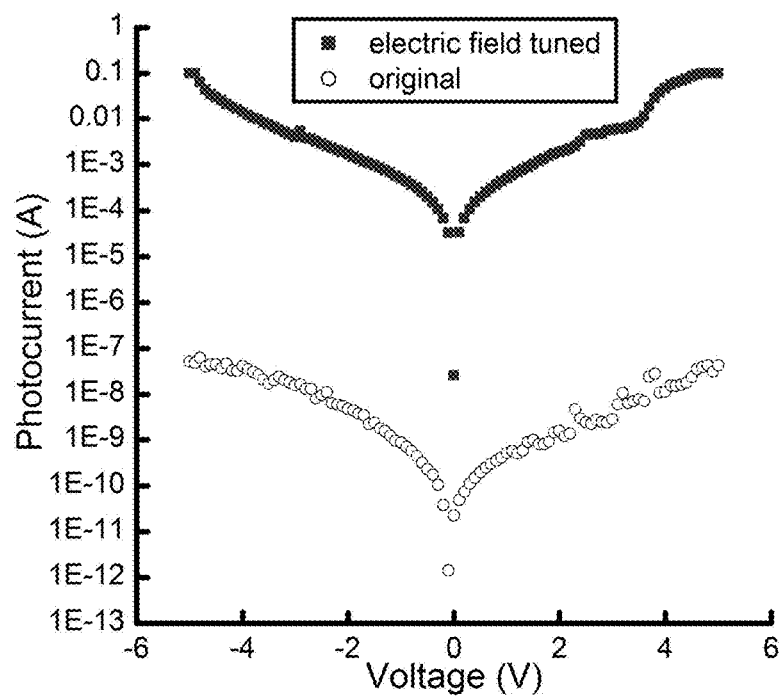
FIG. 15 is a graph comparing the photocurrent verses voltage of a electrically treated thin film and an untreated thin film. The comparison shows over six order improvement of photocurrent under illumination from an AM 1.5 solar simulator.

Electrically tuned quantum dot layers also showed significant improvements in photoconductivity across the device. Testing the device under AM 1.5 solar simulated sunlight, over four orders improvement of photoconductivity at zero bias and more than six orders improvement at 5V bias have been demonstrated in a sandwich structure quantum dot photovoltaic cell, as shown in the graph of FIG. 15. As such, the devices produced show an increase QD transport properties, along with a means to direct carrier transport in a desired way for QD device performance maximization.

Example 4

In order to investigate the anisotropic transport properties tuned by electric fields, the field effect transistor (FET) can be employed for mobility measurements, accompanied by a sandwich structure device used in TOF and CELIV measurements.

Measuring Free Carrier Transport (FCT) Via TOF and CELIV

Figure 16:
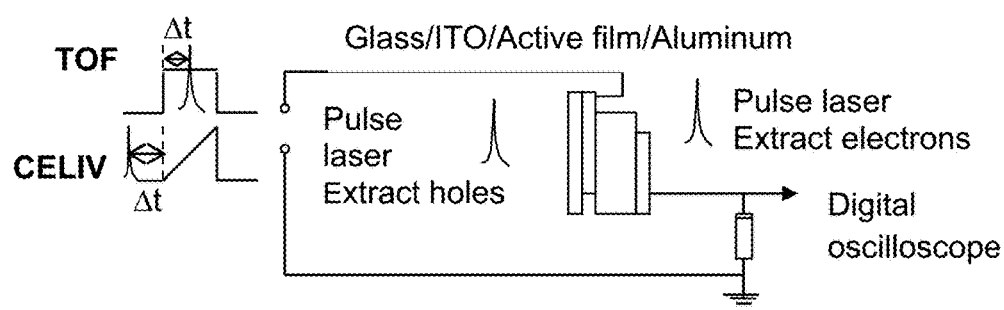
FIG. 16 is a diagram of the setups for time of flight (TOF) and Charge Extraction by Linearly Increasing Voltage (CE-LIV).

Two complementary transient transport techniques, namely the Time of Flight (TOF) and Charge Extraction by Linearly Increasing Voltage (CELIV), are suitable for measuring FCT because the charge mobility, recombination mechanism, interplay of trap states, and Gaussian DOS transport sites can be simultaneously studied. TOF is limited to low conductive materials and thick films (d~µm), whereas CELIV measurement is capable of measuring higher conductivity materials and in much thinner film (~100 nm). As shown in FIG. 16, the setups for TOF and CELIV share common features. The second harmonic (523.5 nm) of a Nd:YLF Q-switched infrared ns pulse/CW laser (JDSU M110-1047 series, pulse duration<7 ns) and a Stanford Research Systems (SRS) $N_2$ laser (337 nm) with a pulse duration of 3.5 ns are used for carrier photo-generation. A SRS DS345 arbitrary pulse generator is used to generate the voltage pulse. A sandwich structure device with appropriate thickness is employed in both experiments. Either from the transparent ITO or the metal contact side, the pulse laser illuminates, depending on the type of carriers being extracted.

Time of Flight (TOF)

Time of Flight (TOF) measurement is a basic method to study transport properties of thin films made with low mobility semiconductors ($\mu \ll 1$ cm$^2$/V·S), such as amorphous silicon and π-conjugated polymers (PCPs). Photo-generated charges are produced near one electrode by a short pulse laser, and then drift through a thick film (~several µm) toward another electrode under an applied square electric field E (or bias V). From the measurement of the carrier transit time $t_{tr}$, the mobility (µ) of correspondent carriers (electron or holes) could be calculated as $$\mu = \frac{d}{(T_{tr}E)} = \frac{d^2}{(t_{tr}V)},$$

where d is the thickness of then film. Normally one works in the so-called differential-mode where the time constant of the measurement set-up is shorter than the transit time: $\tau_{RC} < t_{tr}$, where current transient j (t) is thus measured and $t_{tr}$ is the point where the current transient begins to drop from its plateau region. TOF, alternatively, requires low conductivity to avoid overestimate of sample mobility due to dielectric relaxation, and much shorter charge relaxation time than the transit time for accurate results.

Charge Extraction by Linearly Increasing Voltage (CELIV)

Instead of a constant bias (square) voltage in TOF, CELIV applies a linearly increasing (ramp) voltage (U=At, where A is the voltage rise speed) across a sandwich type sample with two blocking contacts, where a transient current is recorded in the oscilloscope. In a CELIV measurement, a short laser pulse is used to generate the charge carriers, and after a certain delay-time $t_{del}$, the carriers left in the sample are extracted. The time taken to reach the extraction current maximum ($t_{max}$) is used to estimate the drift mobility of the (photo-generated) charge carriers. Dispersion in CELIV current transients can be characterized by the ratio between the time the extraction current reaches its half-width and the time of maximum current, $$\frac{t_{1/2}}{t_{max}}.$$

A theoretical calculated value of 1.2 is considered non-dispersive transport.

Both the hole and electron hole mobility in a pristine PbSe or PbS quantum dot film can be measured using the TOF method because the as-synthesized quantum dots have very low conductivity and mobility. By varying the intensity of the incident light pulse, electric field strength, and the sample temperature, the Langevin recombination process and its mechanism can be probed.

Treated quantum dots are expected to have higher conductivity and mobility; the hole and electron hole mobility can be measured using both TOF and CELIV methods. The comparison between two measurements would be insightful as to what extent carrier diffusion affects charge transport. By varying sample temperature, we could also determine whether the dispersive transport behavior dominates as previously observed with organic polymers.

For each quantum dot composite film, both measurements can again be employed. The focus will be on modified carrier transport due to possible photo-induced charge transfer, comparing with the pure quantum dot film. The bimolecular recombination coefficient (b) and the Langevin recombination coefficient ($\beta_L$) may be measured. The ratio $b/\beta_L$ gives a measure to the limiting factor for quantum dot-based PV devices.

Example 5

Figure 17:
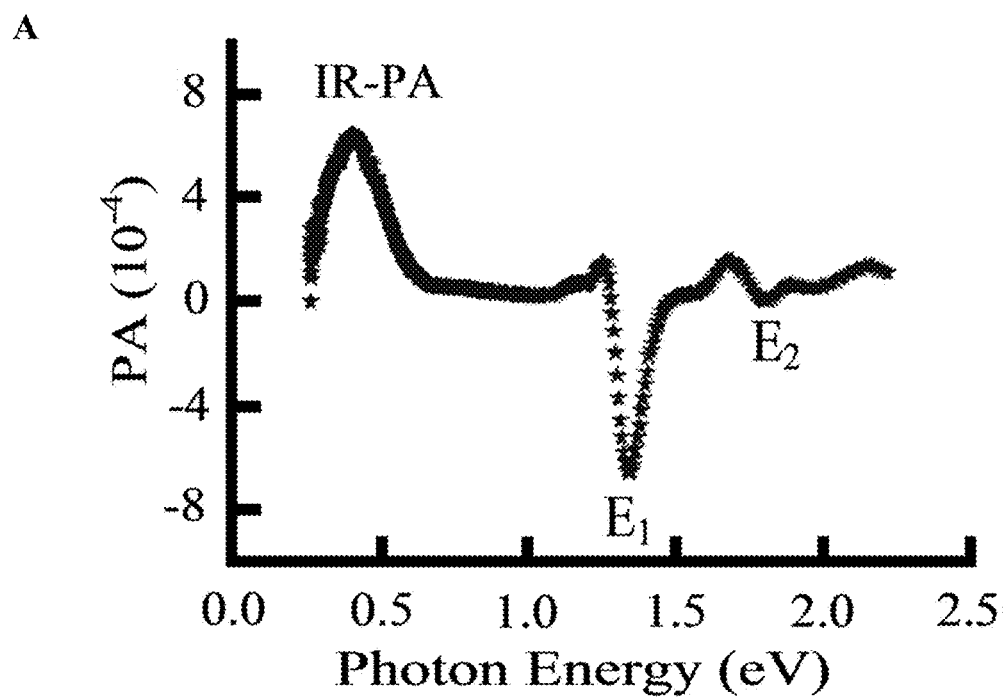
FIGS. 17(A) and (B) are photo-induced absorption information for quantum dots. (A) graph of the photo-induced absorption (PA) spectra of a 4.2 nm PbS quantum dot film measured at T=10K. (B) shows a schematic diagram of the relevant transitions and position of the band gap state level. $E_1$ and $E_2$ are the first and second interband transitions, respectively. $E_1$ is also the quantum dot optical band gap ($E_g$).
Figure 17:
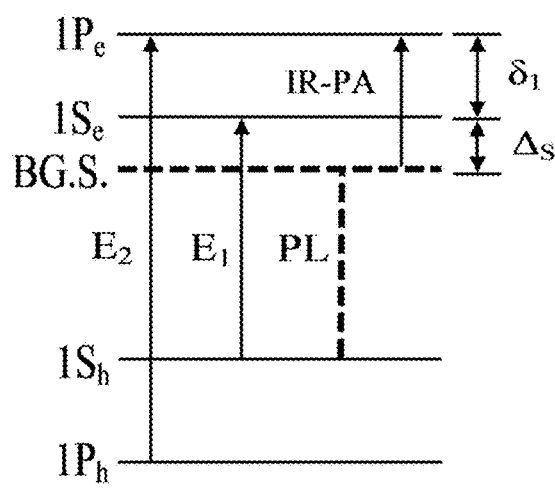

The devices prepared in Example 3 were subjected to spectroscopic gauge to measure photo-induced charge transfer (PCT). A gap state was discovered in pristine lead sulfide (PbS) quantum dot films that shows a confinement-dependent absorption (IR-PA) in the near-infrared range. FIGS. 17(A) and (B) show the photo-induced absorption (PA) spectra of a 4.2 nm PbS quantum dot film measured at T=10K. The inset shows a schematic diagram of the relevant transitions and position of the band gap state level. $E_1$ and $E_2$ are the first and second interband transitions, respectively. $E_1$ is also the quantum dot optical band gap ($E_g$).

By measuring the frequency dependence of this IR-PA, the lifetime of this gap state was estimated to be around several microseconds. The importance of such gap state is illustrated in FIGS. 18(A) through (C), through the analysis of exciton loss mechanism in quantum dots.

Figure 18:
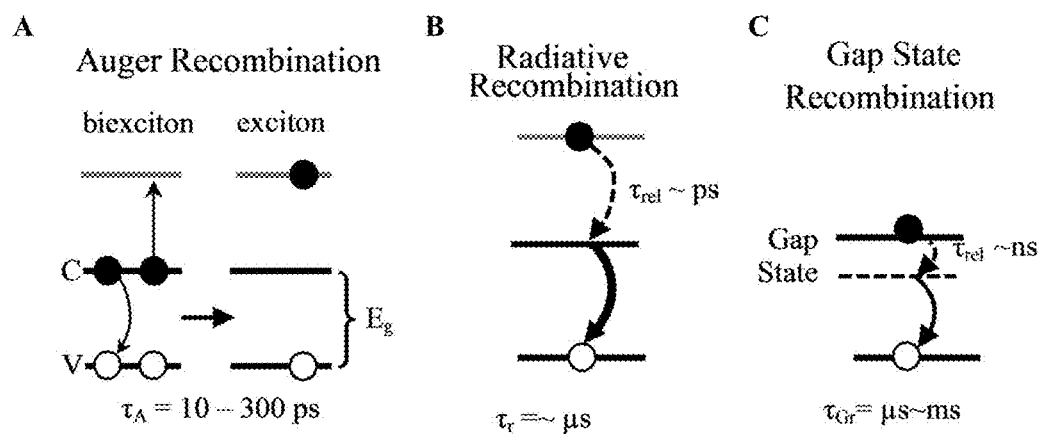
FIGS. 18(A) through (C) are diagrams of recombination. (A) Auger Recombination showing loss of multiple excitons by non-radiative recombination; (B) Radiative Recombination showing loss of excitons; (C) Gap State recombination showing loss of excitons.

As can be seen in FIG. 18(A), Auger Recombination occurs within sub-ps, followed by hot exciton cooling within a picosecond (ps) scale. The radiative recombination, illustrated in FIG. 18(B), was surprisingly slow in these quantum dots in the range of sub-µs, whereas the relaxation to the gap state happens much faster (<ns). Therefore, the final state of photo-generated carriers is the gap state. Due to its long lifetime, this state is directly related to quantum dot device efficiency. This gap state could be used to monitor photo-induced charge transfer (PCT) between quantum dots and polymers, similar to the case seen in π-conjugated polymer and fullerene systems. Moreover, in hybrid nanocomposites of polymers and infrared quantum dots, the detection of the PCT process can be performed using PA measurements of both constituents. This provides a more reliable and accurate study of PCT in the hybrid nanocomposite. It is especially useful when energy transfer (ET) is interplayed with PCT.

Figure 19:
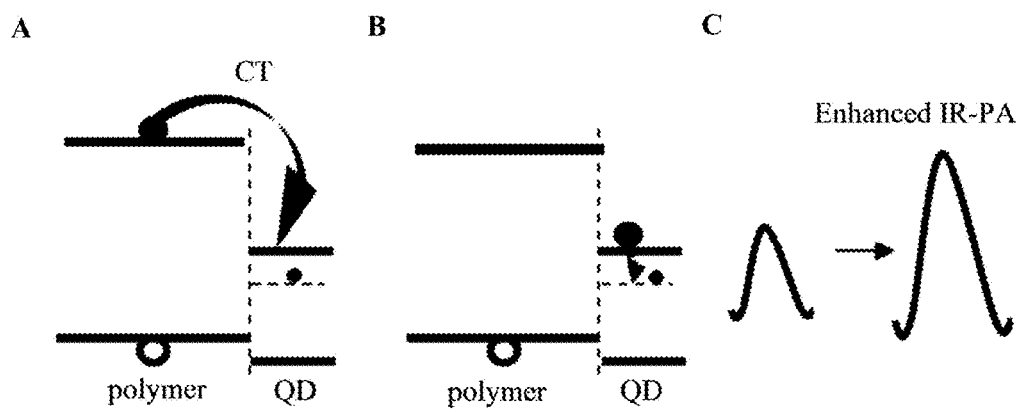
FIGS. 19(A) through (C) are diagrams of IR-PA as a gauge measure of PCT in quantum dot composites. The diagrams illustrate (A) an electron transfer from polymer to quantum dot; (B) an electron relaxing to the gap state; (C) the enhanced IR-PA signal due to increase of population at the gap state.

FIGS. 19(A) through (C) show further why this gap state can be used as a spectral gauge to obtain quantitative information about PCT in quantum dot composites. Using the quantum dot/polymer as an example, when PCT occurs between quantum dots and polymers (with type II band alignment, i.e., an electron transfers from polymer to quantum dots), the increased population at the gap state will result in an increase of the IR-PA signal. Furthermore, the lifetime of the gap state will be altered due to the population change. Both differences can be measured by continuous wave photo-induced absorption spectroscopy. On the other hand, if there is no PCT, no change of IR-PA of quantum dots will be seen.

As such, the methodology herein not only can increase quantum dot transport properties, but also direct carrier transport in a desired way for quantum dot device performance maximization. A thin smooth continuous quantum dot film is very difficult to achieve, but through this novel method, a smoother film has been achieved via closer packed quantum dots. The novel electrical tuning method not only significantly improves photoconductivity across the device, but also helps with quantum dot film morphology which will further enhance charge transfer between quantum dots and its matrices.

Measuring Photo-Induced Charge Transfer (PCT) in Quantum Dot Composites Using a Spectral Gauge Continuous Wave Photo-Induced Absorption (cw-PA) Spectroscopy can be used to study the PCT between quantum dots and its constituents. By monitoring the change of IR-PA peak in terms of energy level and intensity, the PCT rate can be derived. The tuning of the PCT rate can be done via interfacial engineering through various material systems, different passivation layers for quantum dots, and thermal/electrical nanomorphology modification. The considerations may be based on energy level alignment, dielectric matching, and interfaces.

Although transient absorption spectroscopy is usually considered a powerful technique for studying PCT in nanocomposite film, it is incapable of supplying information regarding long-lived photo-generated carriers which are more relevant to device applications. Also, it is an expensive setup not available in many labs.

Figure 20:
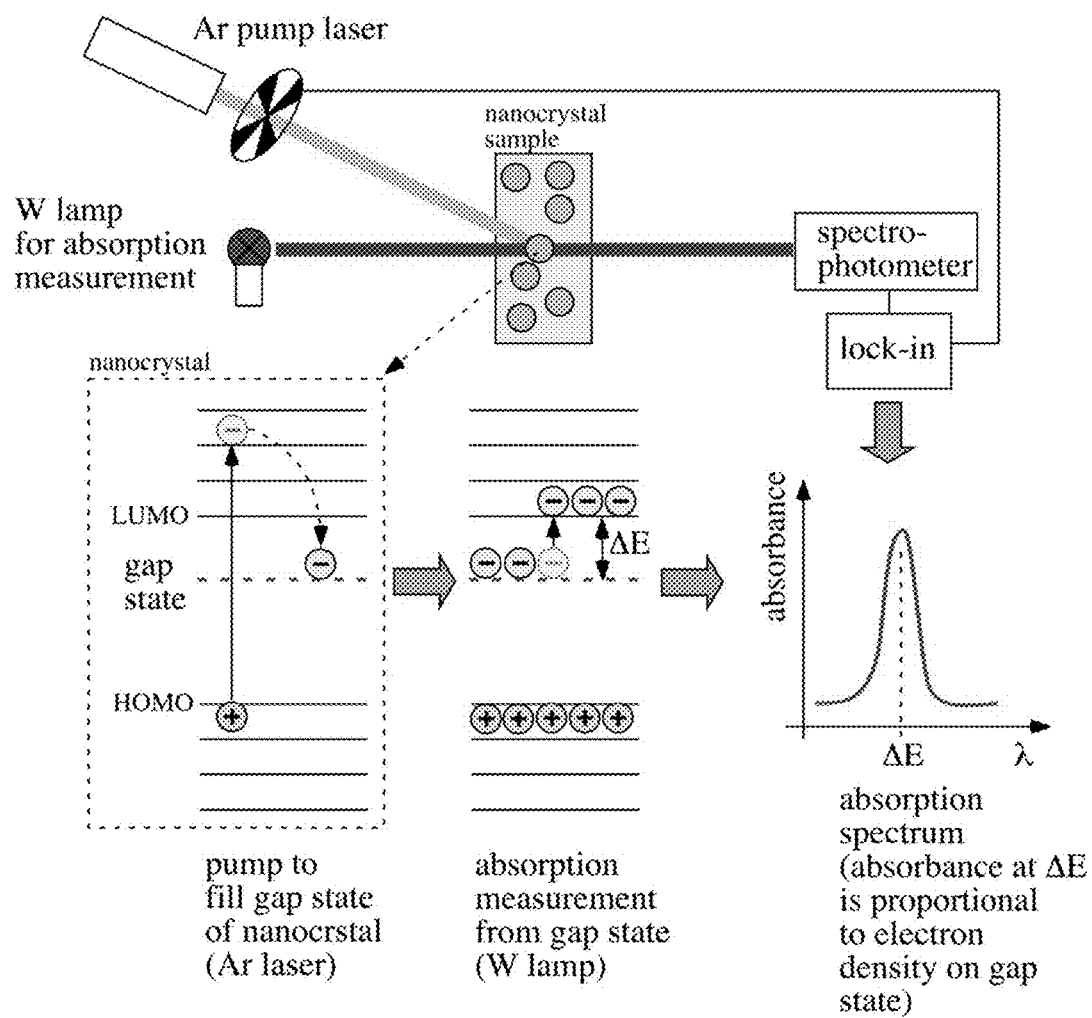
FIG. 20 is a diagram illustrating continuous wave photo-induced absorption spectroscopy. A regular absorption spectrum of a quantum dot is modified by pump-populating a gap state. This gives rise to a new absorption peak ΔE, whose intensity is directly proportional to the electron density on the gap state.

Instead, cw-PA spectroscopy has proven to be a convenient and successful technique to study any below gap long-lived photo excitations. This has been demonstrated in several amorphous semiconductor systems including conjugated polymers. FIG. 20 shows the technique schematically, using a PbS quantum dot film as an example probed sample.

In principle, the technique is a standard absorption measurement combined with a chopped pump laser. The pump (cw Ar+ laser) excites the quantum dots with photons of energy larger than the optical gap of the quantum dots (for example, $E_g$=1.07 eV for a 4 nm PbS quantum dots). The excited electrons thermalize into a long lived gap state, characteristic for IV-VI quantum dots. This changes the absorption spectrum, because now the transition ΔE becomes possible. A new peak arises in the spectrum at a wavelength commensurable with ΔE (for example ΔE=0.33 eV for a 4 nm PbS quantum dot), as is schematically indicated in FIG. 20. A feature of this measurement is that the magnitude of this absorption peak is linearly proportional to the density of the electrons occupying the gap state, whereas its energy position indicates the gap state level. In addition, cw-PA can measure other characteristics of the gap state, including its lifetime (τ) by varying modulation frequency (f), its activation energy ($E_T$) by varying sample temperature (T) and its recombination kinetics by varying pump light intensity. The versatility of this spectroscopy is that the absorption and photoluminescence (PL) measurements may also be carried out using the same setup.

The photo-induced absorption (PA) spectra of the quantum dot nanocomposites and their constituents can be measured. Both below-gap and above-gap excitations in the PA measurements can be conducted. By monitoring the change of the spectral gauge (IR-PA) in terms of energy level and intensity, the PCT rate can be derived. Through systematic studies of frequency, temperature and intensity dependences, information about exciton recombination kinetics can be obtained.

Photoluminescence (PL) decay can be measured with an ns transient spectroscopy. This will give complimentary information about exciton dissociation in the early stage.

PL quenching can be measured in each nanocomposite by measuring the PL quantum efficiency (PLQE) using a special integration sphere. The change of PLQE can be compared with PA results to further determine the influence of interfacial environment on the PCT rate.

Photoluminescence excitation spectroscopy can also be performed on the same cw-PA setup, with an appropriate narrow band pass filter fixed at each emission peak of interest. This measurement can help distinguish origins and correlations of the emission bands. It also can identify possible energy transfer (ET) between different energy states involved.

These two classes of constituent materials differ from each other in terms of several material parameters. For instance, the dielectric constant ε. The majority of polymers have ε~2, yet colloidal quantum dots have much larger ε, with an ε greater than 100 reported in a 12 nm PbSe quantum dot. Dielectric screening of the Coulomb interaction plays an important role in electronic properties of quantum dots. When the high-ε infrared quantum dots are mixed with low-ε polymers, the significant difference between inorganic dipoles and organic dipoles are expected to affect the energy and charge transfer in their composites. By choosing two different types of constituents to mix with the infrared quantum dots, the role of dielectric constants could be found to mismatch in these quantum dot composites in PCT. Note that many D/A combinations could be made through proper choices of different donor and acceptor materials.

Separate Photoinduced Charge Transfer (PCT) and Energy Transfer (ET)

Figure 21:
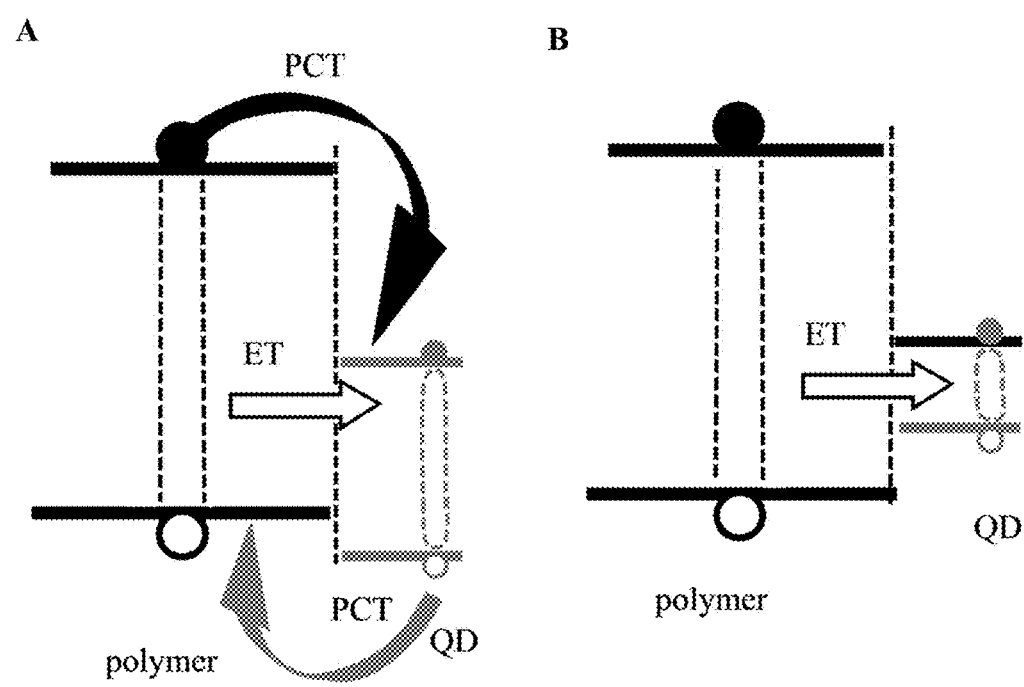
FIGS. 21(A) and (B) are diagrams illustrating the possible energy transfer (ET) and photo-induced charge transfer (PCT) in a polymer/QD system. The illustrations show the QD system (A) under type II band alignment; and (B) under type I band alignment. The solid curved arrow stands for electron transfer to QD, whereas the empty curved arrow stands for hole transfer to polymer. The straight empty arrow indicates energy transfer.

Depending on the band alignment of the constituent and infrared quantum dots, there could be a strong ET process that competes with the PCT process. FIGS. 21(A) and (B) show the possible ET and PCT in a polymer/quantum dot system. In type I band alignment (straddling' conduction and valence levels, FIG. 21(B)), the energetics are dominated by ET, thus one would expect the PL quenching (decrease of PL quantum efficiency) on the visible constituent (e.g., polymer), yet no change of IR-PA of quantum dots from PA measurement (see FIGS. 18(A) through (C)).

On the other hand, PCT is more favorable when the band alignment between infrared quantum dots and the constituent materials is type-II ('staggered' conduction and valance levels, FIG. 21(A)), and the band edge offset is bigger than the exciton binding energy. In this case, the PL quenching will be a combined effect of ET and PCT if the excitation energy is greater than the bandgap of the visible constituent. Because the PCT rate could be measured separately using the spectral gauge, the contribution from ET would also be separately evaluated. Note that with the excitation of only the infrared quantum dot, or both constituents, the analysis of ET and PCT can give us additional information regarding electron transfer and hole transfer, respectively.

Important Points

Modeling of Transport Behaviors in Quantum Dots

Colloidal quantum dots bear lots of similarity to polymers in terms of discrete energy levels, tightly bonded excitons, and optoelectronic properties inherent to film nanomorphology. In low mobility materials, the Langevin bimolecular recombination dominates and sets an upper limit for extraction of photo-generated carriers, thus limiting the efficiency of related PV devices. The Langevin process is a second order type process. The recombination coefficient ($β_L$) is directly proportional to the charge carrier mobility $$\beta_L = \frac{e(\mu_n + \mu_p)}{\varepsilon\varepsilon_0}.$$

Combined with experimental results, a valid model about transport behaviors in pristine quantum dots and quantum dot composites can be built. This will serve as a guide for rationale design of quantum dot-based solar cells.

Formation of the Schottky Barrier

The establishment of the Schottky barrier between the quantum dots and/or quantum dots with contacts is very important for both TOF and CELIV measurements, because a built-in electric field within the depletion layer will enhance the extracted current. The premise for an electron Schottky barrier formation is the existence of a considerable difference between the electrode work function $\phi_m$ and the electron affinity of the semiconductors. So far, Schottky barriers have been found to form only at the metal contact side. It remains a challenge to form Schottky barriers with the transparent ITO electrode.

Where this becomes an issue, the work function of ITO can be modified via formation of a surface states layer between ITO and the composite, such as by spin coating a thin layer of PEDOT:PSS, or evaporating a very thin layer of gold (<20 nm) onto the ITO contact. In addition, an appropriate block contact should be used to avoid injection current. This can be achieved by applying reverse bias to the current extraction contact.

Trap states Modified Transport Behaviors

Quantum dots are known to have issues with trap states due to incomplete passivation of quantum dots during synthesis. Additional traps states also occur during chemical/thermal treatments, and oxidization of dangling bonds to form lead oxide (PbO), lead sulfite ($PbSO_3$) and lead sulfate (PbSO$_4$). Trap states inevitably will affect quantum dot transport characteristics. Various surface passivation approaches can be investigated, including selective, additional or reduced passivation of surface atoms, to gain control over the surface trap density. Selective passivation can be done using oleic acids and tri-n-octylphosphine (TOPO). Previous studies have shown different binding sites for these two ligands on either lead (Pb) or sulfer (S). Additional passivation can be done via soaking of the original quantum dots in different ligand solutions. Reduced passivation can be achieved through washing procedures.

Oxidization affects quantum dot device stability and lifetime. The intentional oxidization effect can be investigated by exposing quantum dots in pure $O_2$, $O_2+H_2O$ and $O_2+H_2O$+light environments. Temperature and $O_2$ exposure time (in solution or on film) will be some of the controlled factors. By tuning the trap states via the chemical and/or thermal treatments and also correlating with the results from cw-PA spectroscopy, the factor that affects mobility the most, interdots distance, carrier density, or trap states, will be found.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

The disclosure of all publications cited above are expressly incorporated herein by reference, each in its entirety unless otherwise indicated, to the same extent as if each were incorporated by reference individually.

It is also to be understood that the following claims are intended to cover all of the generic and specific features of the invention herein described, and all statements of the scope of the invention which, as a matter of language, might be said to fall there between.

What is claimed is:

1. A thin film device comprising:
   a patterned substrate;
   a smooth film comprising quantum dots disposed on the patterned substrate, wherein the smooth film was made by the steps:
   drop-casting a solution of ligand-quantum dots onto the patterned substrate to create a thin film;
   while the solution of ligand-quantum dots is drying, applying an electric field starting at about 5V and increasing the electric field in about 5V increments up to about 50V;
   wherein the foregoing steps result in the smooth film having an average roughness of about 0.3 nm; and
   a thin layer of metal disposed on the smooth film.

2. The device of claim 1, wherein the patterned substrate is a glass substrate, or an ITO glass substrate.

3. The device of claim 1, wherein quantum dots in the solution of ligand-quantum dots comprises Group IV-VI quantum dots.

4. The device of claim 3, wherein the quantum dots are PbS quantum dots, PbSe quantum dots, PbTe quantum dots, PbSe—PbTe quantum dots, SbTe$_2$—PbTe quantum dots, AgSbTe$_2$—PbSe quantum dots, alloys of PbTe quantum dots, alloys of PbSe quantum dots, PbSn$_x$Se$_{1-x}$ quantum dots, CdSe quantum dots, or CdS quantum dots.

5. The device of claim 1, wherein ligand of the ligand-quantum dots is pyridine, butylamine, or oleic acid.

6. The device of claim 1, wherein the electric field is a DC electric field.

7. The device of claim 1, wherein the metal is aluminum.

8. The device of claim 2, further comprising a thin layer of PEDOT:PSS disposed on the ITO glass substrate.

9. The device of claim 1, wherein the duration between each increment increase in the application of the electric filed is between about one and about two minutes.

10. The thin film device of claim 9, wherein the applying of the electric field, further comprises the steps:
    reaching a first predetermined voltage;
    maintaining the predetermined voltage for about 2 minutes;
    increasing the voltage by 5V increment over about 30-40 seconds; and
    reaching a second predetermined voltage, wherein the second predetermined voltage is 5V more than the first predetermined voltage.

11. The device of claim 1, further comprising an electroconductive polymer disposed with the ligand-quantum dots of the smooth film, wherein the electroconductive polymer is P3HT, MEH-PPV, PPE, HT-HT PDDTV, TT-HH PDDTV, or poly(3-dodecylthienylenevinylene).

12. The device of claim 11, wherein the electroconductive polymer is added to the solution of ligand-quantum dots, where the solution possesses a polymer to quantum dot ratio of 1:1.

13. A thin film device comprising:
    a patterned substrate;
    a smooth film comprising quantum dots disposed on the patterned substrate, wherein the smooth film was made by the steps:
    drop-casting a solution of ligand-quantum dots onto the patterned substrate to create a thin film;
    while the solution of ligand-quantum dots is drying, applying an electric field starting at about 5V and increasing the electric field in about 5V increments up to about 50V, further comprising:
    reaching a first predetermined voltage;
    maintaining the first predetermined voltage for about 2 minutes;
    increasing the voltage by 5V increment over about 30-40 seconds; and
    reaching a second predetermined voltage, wherein the second predetermined voltage is 5V more than the first predetermined voltage;
    wherein the foregoing steps result in the smooth film having an average roughness of about 0.3 nm; and
    a thin layer of metal disposed on the thin film.

14. The device of claim 13, wherein the patterned substrate is a glass substrate, or an ITO glass substrate.

15. The device of claim 13, wherein the solution of ligand-quantum dots comprises Group IV-VI quantum dots.

16. The device of claim 15, wherein the Group IV-VI quantum dots are PbS quantum dots, PbSe quantum dots, PbTe quantum dots, PbSe—PbTe quantum dots, SbTe$_2$—PbTe quantum dots, AgSbTe$_2$—PbSe quantum dots, alloys of PbTe quantum dots, alloys of PbSe quantum dots, PbSn$_x$Se$_{1-x}$ quantum dots, CdSe quantum dots, or CdS quantum dots.

17. The device of claim 13, wherein ligand of the ligand-quantum dots is pyridine, butylamine, or oleic acid.

18. The device of claim 13, wherein the electric field is a DC electric field.

19. The device of claim 13, wherein the metal is aluminum.

\* \* \* \* \*